(12) United States Patent
Onishi

(10) Patent No.: US 8,854,128 B2
(45) Date of Patent: Oct. 7, 2014

(54) AMPLIFYING DEVICE AND SIGNAL PROCESSING DEVICE

(75) Inventor: Masahiko Onishi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 197 days.

(21) Appl. No.: 13/516,631

(22) PCT Filed: Nov. 10, 2010

(86) PCT No.: PCT/JP2010/070039
§ 371 (c)(1),
(2), (4) Date: Jun. 15, 2012

(87) PCT Pub. No.: WO2011/086752
PCT Pub. Date: Jul. 21, 2011

(65) Prior Publication Data
US 2012/0256688 A1    Oct. 11, 2012

(30) Foreign Application Priority Data
Jan. 14, 2010    (JP) ................................ 2010-006084

(51) Int. Cl.
*H03G 3/20* (2006.01)
(52) U.S. Cl.
USPC ............................ 330/136; 330/127; 330/297
(58) Field of Classification Search
USPC ......................................... 330/136, 127, 297
IPC ..................................................... H03G 3/20
See application file for complete search history.

(56) References Cited

U.S. PATENT DOCUMENTS

| 5,251,330 | A | 10/1993 | Chiba et al. |
| 7,092,683 | B2 * | 8/2006 | Tanaka et al. ................. 455/108 |
| 8,013,674 | B2 * | 9/2011 | Drogi et al. ................... 330/136 |
| 8,489,046 | B2 * | 7/2013 | Liang et al. ................ 455/127.1 |
| 8,649,746 | B2 * | 2/2014 | Kang et al. ................. 455/114.3 |
| 2010/0060358 | A1 * | 3/2010 | Nentwig ....................... 330/199 |
| 2010/0220770 | A1 | 9/2010 | Oka |

FOREIGN PATENT DOCUMENTS

| JP | 2006-333445 A | 12/2006 |
| JP | 2009-194575 A | 8/2009 |
| JP | 2009-290283 A | 12/2009 |
| WO | WO-2007-074663 A | 7/2007 |

OTHER PUBLICATIONS

Extended European Search Report of the corresponding European Application No. 10843107.3, dated Feb. 6, 2013.

* cited by examiner

*Primary Examiner* — Patricia Nguyen
(74) *Attorney, Agent, or Firm* — Global IP Counselors, LLP

(57) ABSTRACT

Signal timing adjustment in an amplifying device is appropriately performed by phase adjustment by a digital filter. The amplifying device includes an amplifier; an amplitude-voltage converting unit 12 that performs a desired process on a signal relating to operation of the amplifier, whereby the signal is band-broadened; and a timing adjusting unit 15a that performs timing adjustment of the signal to be provided to the amplifier, by phase adjustment by a digital filter. The timing adjusting unit 15a performs the timing adjustment of the signal at a stage before the signal is band-broadened by the amplitude-voltage converting unit 12.

5 Claims, 8 Drawing Sheets

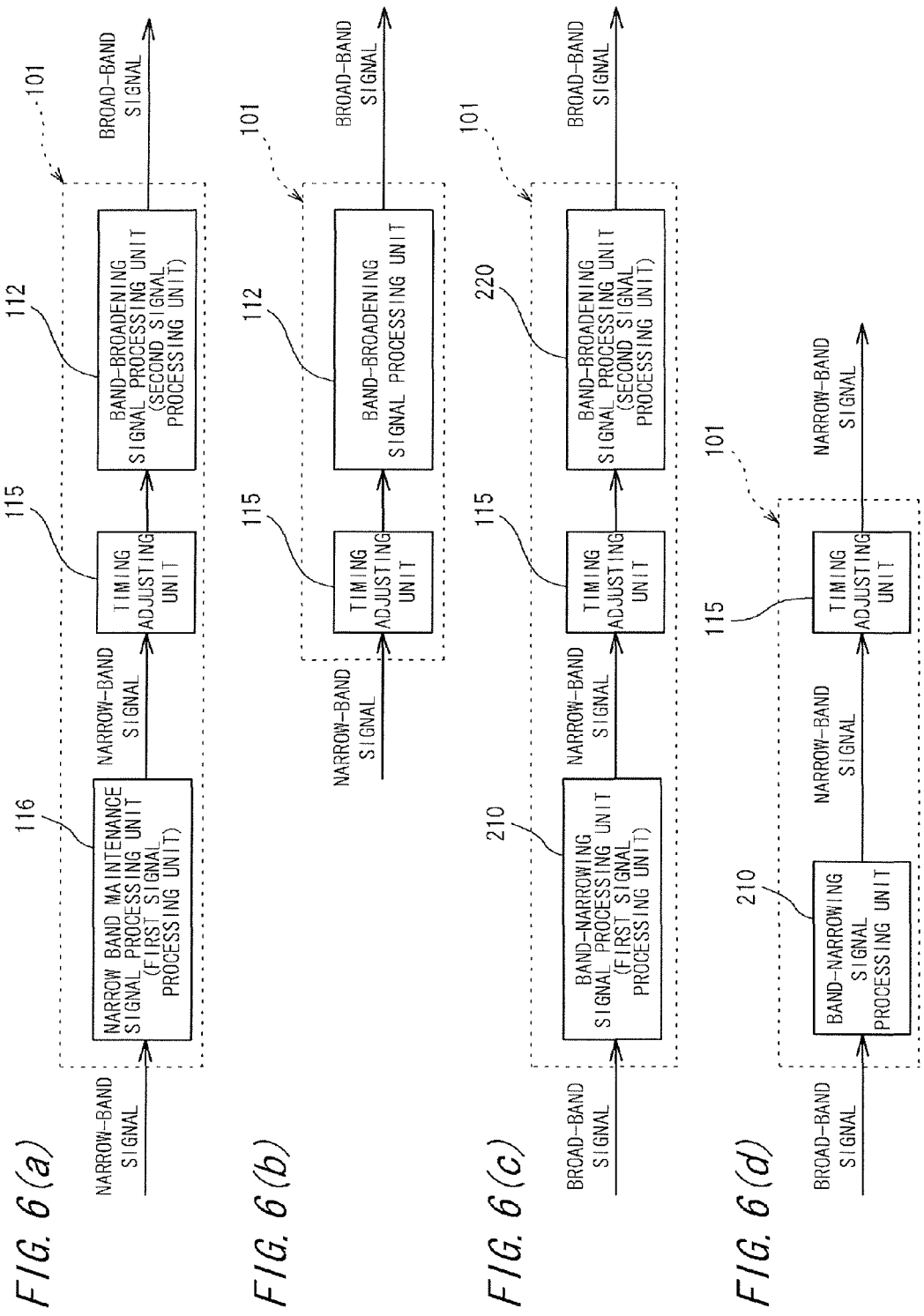

PHASE CHARACTERISTIC OF IDEAL ALL PASS FILTER

AMPLITUDE CHARACTERISTIC OF IDEAL ALL PASS FILTER

PHASE CHARACTERISTIC OF DIGITAL FILTER

AMPLITUDE CHARACTERISTIC OF DIGITAL FILTER

AMPLITUDE CHARACTERISTIC OF DIGITAL FILTER

AMPLIFYING DEVICE AND SIGNAL PROCESSING DEVICE

CROSS-REFERENCE TO RELATED APPLICATIONS

This U.S. National stage application of International Patent Application No. PCT/JP2010/070039, filed Nov. 10, 2010, which, in turn, claims priority under 35 U.S.C. §119(a) to Japanese Patent Application No. 2010-006084, filed in Japan on Jan. 14, 2010, the entire contents of which are hereby incorporated herein by reference.

TECHNICAL FIELD

The present invention relates to an amplifying device and a signal processing device.

BACKGROUND ART

An ET (Envelope Tracking) system is known in which in order to increase the power efficiency of a High Power Amplifier (HPA) the power supply voltage (drain voltage) of the amplifier is modulated according to the envelope of an input signal (RF signal) to the amplifier (see, for example, Japanese Unexamined Patent Publication No. 2009-290283-A). By making the drain voltage variable, the amplifier can be allowed to operate in a high efficiency region.

In addition, as with the ET system, as techniques for increasing power efficiency using an envelope signal, an EER (envelope elimination and restoration) system, etc., are also known.

SUMMARY OF INVENTION

Technical Problem

In a device using an envelope signal such as the ET system or the EER system, there is a need to allow the timings of an envelope signal and an input signal to an amplifier to coincide with each other.

In general, conversion from baseband signals to a high-frequency carrier frequency is performed by a frequency converting unit provided before an input of the amplifier. Hence, the accuracy of adjustment of the timings of an envelope signal and an input signal in the amplifier is determined by the carrier frequency.

Here, to adjust the timings of an envelope signal and an input signal to the amplifier, it is considered to physically shift the timings of the signals by, for example, adjusting the electrical lengths of wiring lines in a circuit. However, for physical timing adjustment, although perfect timing adjustment can be achieved if setting can be done successfully, to perform such setting, there is a need to use an expensive device or to adjust the electrical wiring line lengths with an accuracy of 1/(carrier frequency) [m], causing a problem of an increase in manufacturing cost.

Hence, to simply perform timing adjustment, it is considered to generate a signal (envelope signal or input signal) whose timing is shifted using digital signal processing.

The inventor of the present invention have arrived at the idea of using an all pass filter that changes only group delay without changing the amplitude of a signal, for timing adjustment by digital signal processing.

FIG. 7 shows the characteristics of an ideal all pass filter (a phase characteristic and an amplitude characteristic) for delaying timing by phase adjustment. As shown in (a) of FIG. 7 the phase characteristic is a linearly downward characteristic, and as shown in (b) of FIG. 7 the amplitude characteristic is a flat characteristic at 0 [dB]. By using a filter having the characteristics shown in FIG. 7, the timing of a signal can be appropriately adjusted without changing the amplitude of the signal.

However, in digital signal processing, it is impossible to make a completely ideal all pass filter.

To make group delay constant, either an FIR (Finite Impulse Response) filter having a linear phase characteristic over the entire frequency range or an IIR (Infinite Impulse Response) filter structure having a partially linear phase characteristic is taken. However, as shown in FIG. 8, a phase-frequency characteristic and an amplitude-frequency characteristic are shifted from the ideal ones, and thus, it is difficult to obtain excellent characteristics for all frequencies. Specifically, as indicated by solid lines in the characteristic diagram in FIG. 8, the phase-frequency characteristic and the amplitude characteristic are degraded on the high frequency side. Note that the amplitude characteristic involves not only the case in which as shown in (b) of FIG. 8 the gain decreases on the high frequency side, but also the case in which as shown in (c) of FIG. 8 a phenomenon called the Gibbs phenomenon where the gain has a wavy pattern appears.

As such, although the characteristics of the digital filter can be brought close to the characteristics of an ideal all pass filter by increasing the number of taps of the filter, it is not desirable in terms of device cost. On the other hand, even if the number of taps of the filter is reduced and timing adjustment is attempted by the digital filter, timing adjustment may not be able to be appropriately performed or an undesirable change in the amplitude of a signal may occur.

An object of the present invention is therefore to provide an amplifying device and a signal processing device that are capable of performing appropriate signal timing adjustment by phase adjustment by a digital filter.

(1) An amplifying device according to the present invention includes: an amplifier; a signal processing unit that performs a desired process on a signal relating to operation of the amplifier, whereby the signal is band-broadened; and a timing adjusting unit that performs timing adjustment of the signal to be provided to the amplifier, by phase adjustment by a digital filter, wherein the timing adjusting unit is provided to perform the timing adjustment of the signal at a stage before the signal is band-broadened by the signal processing unit.

Even if a digital filter has characteristics that are degraded in a large frequency range, the digital filter can obtain excellent characteristics close to ideal characteristics in a relatively narrow frequency band. However, with a band-broadened signal, it is difficult to use excellent characteristics. The inventor of the present invention have realized that signal processing included in an amplifying device band-broadens a signal and have found that excellent characteristics can be used by performing timing adjustment before the signal processing where the signal is band-broadened.

According to the above-described invention, at a stage before a signal is band-broadened, timing adjustment of the signal is performed, and thus, timing adjustment can be performed using excellent characteristics of the digital filter.

(2) The timing adjustment by the timing adjusting unit is performed to allow timing of an input signal to be provided to an input of the amplifier to coincide with timing of an envelope signal of the input signal. In this case, the timings of an input signal and an envelope signal can be appropriately adjusted by the digital filter.

(3) The signal processing unit is, for example, a converting unit configured to convert an envelope signal of the input signal to be provided to an input of the amplifier into a power supply voltage value of the amplifier, and band-broaden the envelope signal upon the conversion. According to the present invention, even if such a converting unit is included in the amplifying device, timing adjustment can be appropriately performed.

(4) It is preferred that the amplifying device includes a detecting unit that performs detection on the input signal to generate the envelope signal, wherein the detecting unit is configured to output an envelope signal generated considering a value obtained by computation of $(I^2+Q^2)$ as an amplitude value, when values of an I signal and a Q signal forming the input signal are represented by I and Q, respectively. The accurate amplitude of the input signal is determined by computation of $(I^2+Q^2)^{1/2}$ but computation of $[(.)^{1/2}]$ band-broadens the signal. Hence, by avoiding this computation and generating an envelope signal considering a value obtained by computation of $(I^2+Q^2)$ as an amplitude value and performing timing adjustment on the envelope signal, performance of timing adjustment on a broad-band signal can be avoided.

(5) It is preferred that the amplifying device includes a detecting unit that accepts, as input, an I signal and a Q signal forming the input signal and computes an amplitude value of the input signal from the inputted I and Q signals to generate the envelope signal, a band of the envelope signal being wider than that of the I or Q signal, wherein the timing adjusting unit is provided to perform timing adjustment on each of the I and Q signals inputted to the detecting unit. In this case, since timing adjustment is performed on each of the I and Q signals before being band-broadened, performance of timing adjustment on a broad-band signal can be avoided.

(6) The signal processing unit is, for example, a pre-distorter configured to perform a distortion compensation process on the input signal to be provided to an input of the amplifier to compensate for distortion characteristics of the amplifier, and band-broaden the input signal upon the distortion compensation process. In this invention, even if such a pre-distorter is included, timing adjustment can be appropriately performed.

(7) According to another aspect of the present invention, an amplifying device includes: an amplifier; a detecting unit that performs detection on the input signal to generate an envelope signal; a converting unit that converts the envelope signal into a power supply voltage value of the amplifier; and a timing adjusting unit that performs timing adjustment on the envelope signal by phase adjustment by a digital filter, wherein the detecting unit is configured to output an envelope signal generated considering a value obtained by computation of $(I^2+Q^2)$ as an amplitude value, when values of an I signal and a Q signal forming the input signal are represented by I and Q, respectively.

According to the above-described invention, the detecting unit generates an envelope signal considering a value obtained by computation of $(I^2+Q^2)$ as an amplitude value. Since computation of $(I^2+Q^2)$ does not band-broadens a signal, the band of the original I/Q signal is maintained. In the above-described invention, timing adjustment is performed on an envelope signal with a narrow band maintained and thus performance of timing adjustment on a broad-band signal can be avoided.

(8) In the above-described (1) to (7), the digital filter has substantially ideal characteristics where a phase of a signal in a frequency band in a predetermined range is changed as desired for timing adjustment, and a frequency band of the signal on which timing adjustment is performed by the timing adjusting unit is substantially within the frequency band in the predetermined range.

(9) According to another aspect of the invention, a signal processing device includes: a signal processing unit that performs a desired process on a signal, whereby the signal is band-broadened; and a timing adjusting unit that performs timing adjustment of the signal by phase adjustment by a digital filter, wherein the timing adjusting unit is provided to perform the timing adjustment of the signal at a stage before the signal is band-broadened by the signal processing unit.

According to the above-described invention, at a stage before a signal is band-broadened, timing adjustment of the signal is performed, and thus, timing adjustment can be performed using excellent characteristics of the digital filter.

(10) According to still another aspect of the present invention, a signal processing device includes: a band-narrowing signal processing unit that performs a process of band-narrowing a signal; and a timing adjusting unit that performs timing adjustment of the band-narrowed signal by phase adjustment by a digital filter.

According to the above-described invention, since a process of band-narrowing a signal is performed and timing adjustment of the band-narrowed signal is performed, even if a broad-band signal is inputted to the signal processing device, timing adjustment can be appropriately performed.

(11) In the above-described (9), it is preferred that the signal processing device further includes a signal processing unit that performs a desired process on a signal, whereby the signal is band-broadened, wherein the timing adjusting unit is provided to perform the timing adjustment of the signal at a stage before the signal is band-broadened by the signal processing unit. In this case, at a stage before a signal is band-broadened, timing adjustment of the signal is performed, and thus, timing adjustment can be performed using excellent characteristics of the digital filter.

(12) According to yet another aspect of the present invention, a signal processing device includes: a first signal processing unit that performs a first process on a signal; a second signal processing unit that performs a second process on the signal at a stage later than that of the first processing unit; and a timing adjusting unit that performs timing adjustment of the signal by phase adjustment by a digital filter at a stage between the first signal processing unit and the second signal processing unit, wherein a band of a signal inputted to the timing adjusting unit is narrower than that of a signal inputted to the first signal processing unit or a signal outputted from the second signal processing unit.

According to the above-described invention, even if one or both of the band of a signal inputted to the first signal processing unit and the band of a signal outputted from the second signal processing unit is a broad band, the band of a signal inputted to the timing adjusting unit is narrower than that. Therefore, according to the above-described invention, a range in a digital filter where excellent characteristics close to ideal characteristics can be obtained is more easily used.

According to the present invention, appropriate signal timing adjustment can be performed by phase adjustment by a digital filter.

BRIEF DESCRIPTION OF DRAWINGS

FIG. 6 is a block diagram of signal processing devices.

DETAILED DESCRIPTION OF EMBODIMENTS

Preferred embodiments of the present invention will be described below with reference to the accompanying drawings.

[1. First Embodiment and Comparative Example Regarding an Amplifying Device Adopting a Timing Adjustment Technique]

Figure 1:
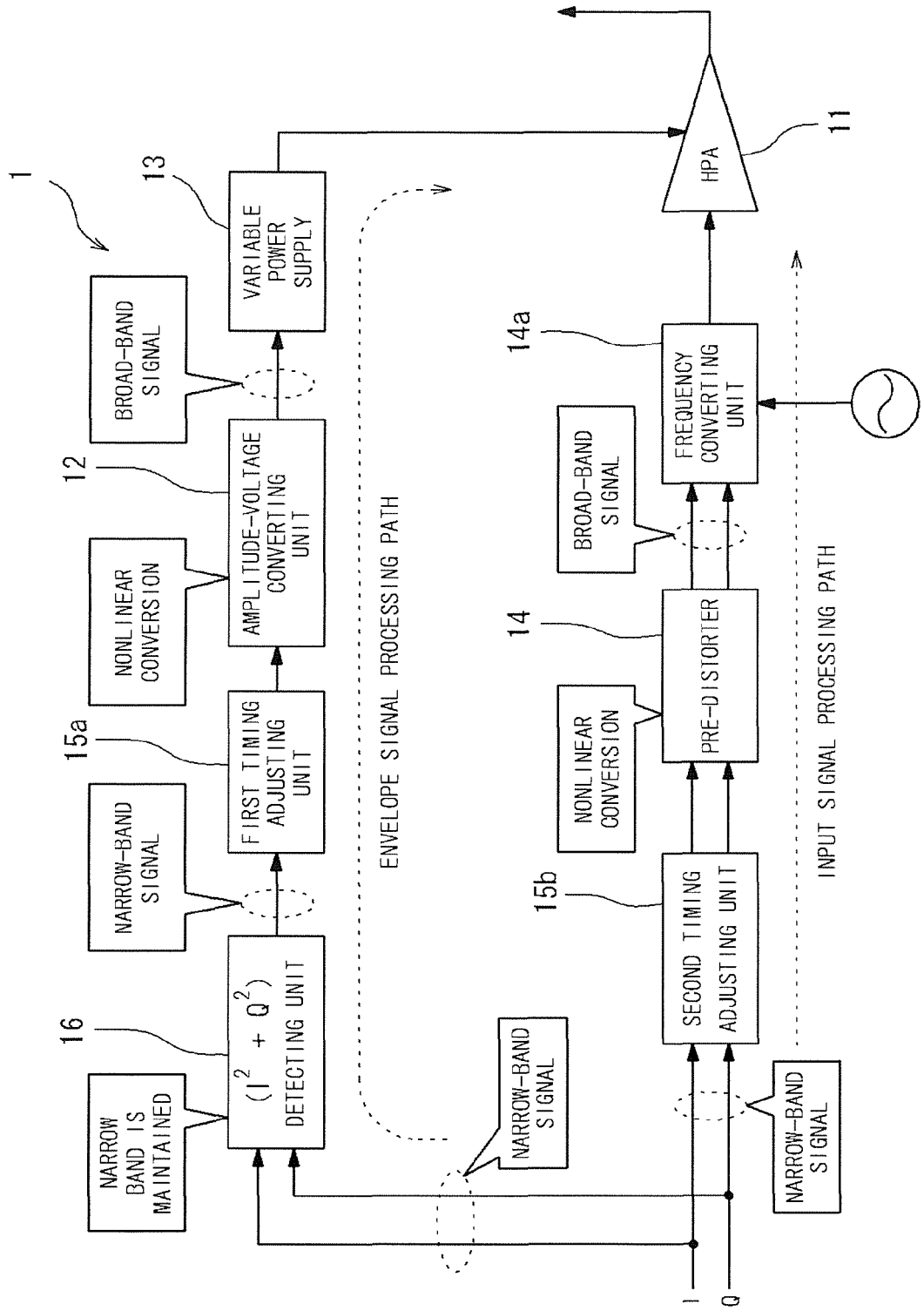
FIG. 1 is a block diagram of an amplifying device according to a first embodiment.
Figure 2:
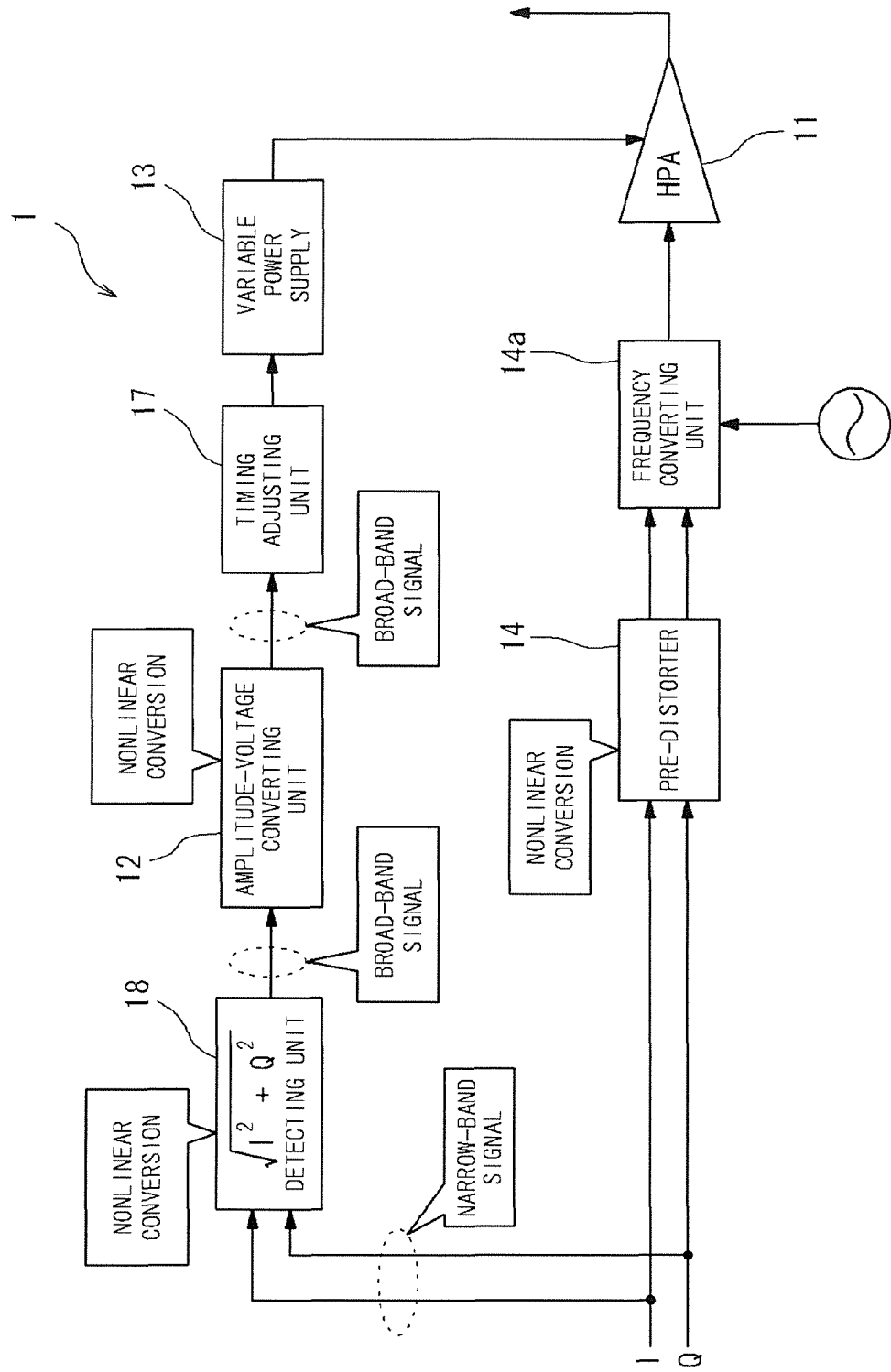
FIG. 2 is a block diagram of an amplifying device according to a comparative example.

FIGS. 1 and 2 show a first embodiment and a comparative example regarding an amplifying device adopting a timing adjustment technique. The circuits shown in FIGS. 1 and 2 have a common basic configuration except for detection of input signal (baseband I and Q signals) and timing adjustment. Hence, first, the configuration common between FIGS. 1 and 2 will be described and then configurations specific to FIGS. 1 and 2 will be described.

[1.1 Configuration Common Between FIGS. 1 and 2]

An amplifying device 1 shown in FIGS. 1 and 2 is to be provided in a communication transmitter and includes an amplifier (HPA) 11. The amplifying device 1 includes an amplitude-voltage converting unit 12 that converts a signal amplitude indicated by an envelope signal which is obtained from input signal (baseband I and Q signals) to the amplifier, into the value of power supply voltage (drain voltage) to the amplifier 11; and a variable power supply 13 that supplies a power supply voltage according to the power supply voltage value outputted from the amplitude-voltage converting unit 12, to the amplifier 11.

By the amplifying device 1 including the converting unit 12 and the variable power supply 13, an increase in efficiency by the ET system is achieved.

In addition, the amplifying device 1 is provided with a pre-distorter (DPD; Digital Pre-Distorter) 14 for compensating for the distortion characteristics of the amplifier 11. The pre-distorter 14 performs a distortion compensation process according to the distortion characteristics of the amplifier 11 on the input signal (baseband signal). More specifically, the pre-distorter 14 monitors input and output signals to/from the amplifier 11 and grasps the input-output characteristics of the amplifier 11 from the input and output signals. Then, the pre-distorter 14 adds characteristics inverse to distorted amplifier input-output characteristics to the input signal and thereby cancels out distortion in the amplifier 11.

The process of conversion from amplitude to power supply voltage performed by the amplitude-voltage converting unit 12 and the distortion compensation process performed by the pre-distorter are performed in baseband frequency for ease of signal processing.

The signals (baseband signals) having been subjected to distortion compensation by the pre-distorter 14 are frequency-converted by a frequency converting unit 14a to a carrier frequency which is a higher frequency than the baseband frequencies, and the signal is provided to an input of the amplifier 11.

[1.2 Configuration in FIG. 1 (First Embodiment)]

The amplifying device 1 shown in FIG. 1 includes a first timing adjusting unit 15a provided along an envelope signal processing path where a process for an envelope signal is performed; and a second timing adjusting unit 15b provided at a location along an input signal processing path where a process for input signal to be provided to the amplifier 11 is performed, and later in stage than the location where input signal are detected for generation of an envelope signal. The timing adjusting units 15a and 15b are to perform delay adjustment.

The first timing adjusting unit 15a is provided immediately before the amplitude-voltage converting unit 12 and performs timing adjustment of a signal (envelope signal) to be inputted to the amplitude-voltage converting unit 12. The second timing adjusting unit 15b is provided immediately before the pre-distorter 14 and performs timing adjustment of signals (baseband I and Q signals) to be inputted to the pre-distorter 14. Note that timing adjustment may be performed by only one of the first and second timing adjusting 15a and 15b.

Figure 8A:
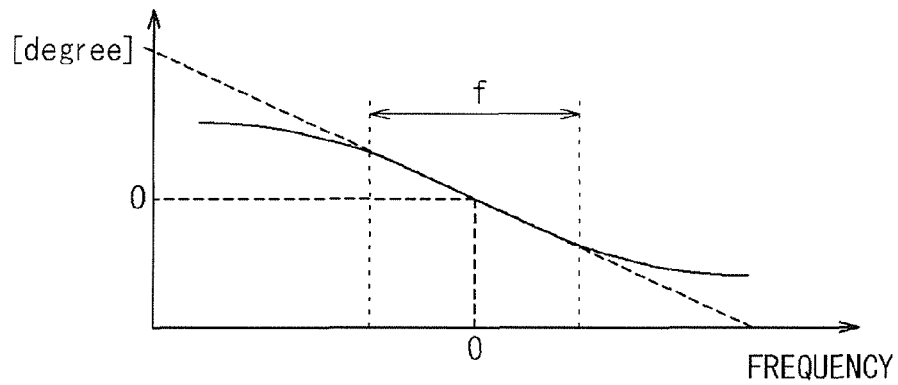
FIG. 8 is a characteristic diagram of an FIR filter.
Figure 8B:
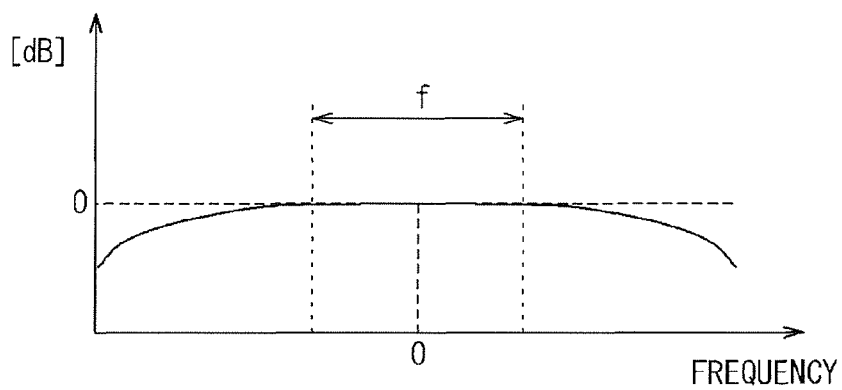
Figure 8C:
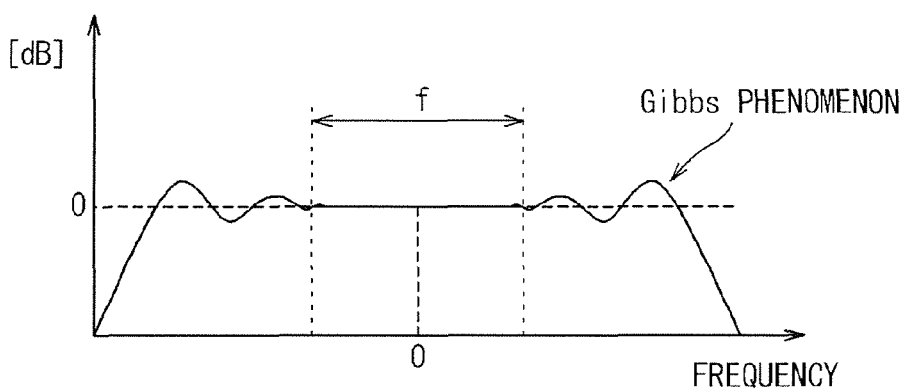

Each of the first and second timing adjusting units 15a and 15b is formed by a digital filter of an FIR filter configuration, and has characteristics such as those shown in FIG. 8 and is not an ideal all pass filter. Note, however, that in the amplifying device according to the first embodiment the first and second timing adjusting units 15a and 15b are configured to perform a process of delaying a signal by a predetermined time by appropriately performing phase adjustment without changing amplitude.

Note that the amount of delay adjusted by the timing adjusting units 15a and 15b may be the amount of delay measured in advance (the amount of delay determined statically) or may be the amount of delay determined dynamically as shown in Patent Literature 1. Dynamic determination of the amount of delay can be made by, as shown in Patent Literature 1, obtaining input-output characteristics of the amplifier and determining the amount of adjustment (the amount of delay) according to the input-output characteristics.

Since the amount of timing adjustment is determined by the filter coefficients of a digital filter (FIR filter or IIR filter), to obtain a desired amount of timing adjustment the filter coefficients are adjusted.

In addition, the amplifying device 1 shown in FIG. 1 includes a detecting unit 16 that performs detection on the input signal (baseband signal, I and Q signals). The detecting unit 16 generates an envelope signal, considering a value obtained by performing computation of $(I^2+Q^2)$ using detected values I and Q when the values of the I and Q signals are I and Q, respectively, as the amplitude value of the signal. The first timing adjusting unit 15a and 15b performs timing adjustment on the signal (envelope signal) outputted from the detecting unit 16.

The significance of the detecting unit 16 will be described later.

[1.3 Configuration in FIG. 2 (Comparative Example)]

The amplifying device 1 according to the comparative example is also provided with a timing adjusting unit 17 which is the same as the first and second timing adjusting units 15a and 15b shown in FIG. 1. That is, the timing adjusting unit 17 is also a digital filter having the characteristics shown in FIG. 8. Note, however, that the timing adjusting unit 17 is provided between the amplitude-voltage converting unit 12 and the variable power supply 13. That is, the timing adjusting unit 17 performs timing adjustment on a signal (envelope signal) having been subjected to an amplitude-voltage conversion process.

Note that in the amplifying device 1 in FIG. 2 a timing adjusting unit in an input signal processing path is omitted.

In addition, the amplifying device shown in FIG. 2 also includes a detecting unit 18 that performs detection on input signal (baseband I and Q signals). The detecting unit 18 determines an amplitude value by performing computation of $(I^2+Q^2)^{1/2}$ using detected values I and Q when the values of the I and Q signals are I and Q, respectively, to generate an envelope signal exhibiting change of the amplitude value.

Figure 3A:
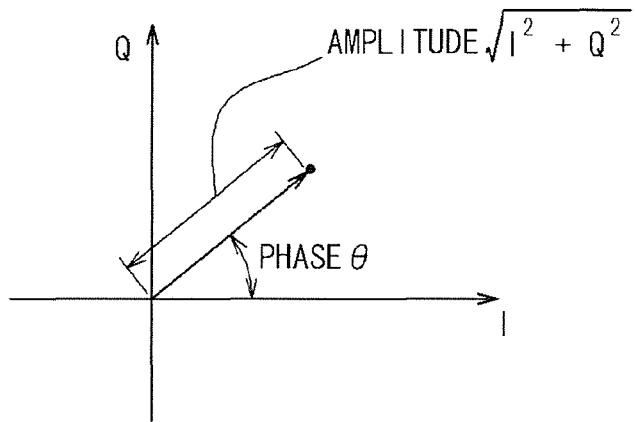
FIG. 3 (a) of FIG. 3 is a diagram showing the amplitude of baseband I and Q signals, (b) of FIG. 3 is a diagram showing the band of the I or Q signal, and (c) of FIG. 3 is a diagram showing the band of $(I^2+Q^2)^{1/2}$.
Figure 3B:
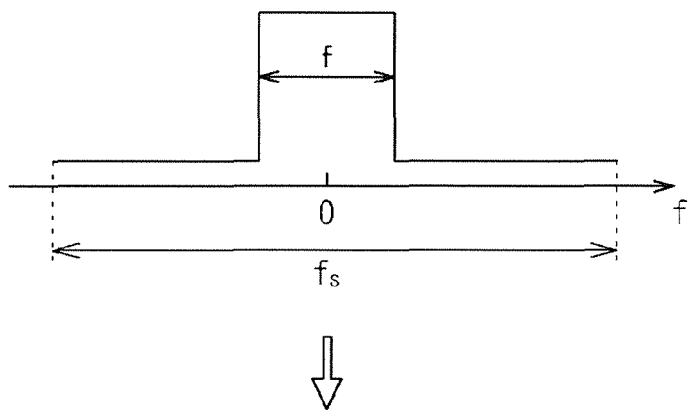
Figure 3C:
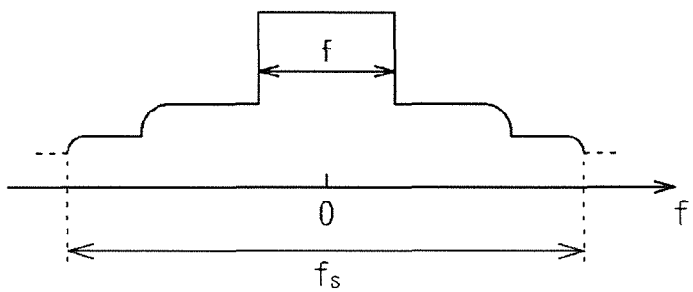

As shown in (a) of FIG. 3, since the amplitude of the baseband input signal is $(I^2+Q^2)^{1/2}$, to perform detection on the baseband input signal, the amplitude should be determined from the baseband I and Q signals according to this equation. The computational expression: $(I^2+Q^2)^{1/2}$ in the detecting unit 18 in FIG. 2 is natural in terms of determining the amplitude of the input signal (baseband signal).

[1.4 Comparison between FIGS. 1 and 2]

Since the detecting unit 18 in FIG. 2 according to the comparative example performs computation of $[(.)^{1/2}]$ (square root computation), as shown in (b) and (c) of FIG. 3, the band of a signal (envelope signal) outputted from the detecting unit 18 becomes wider than a band f of the original I or Q signal. That is, the detecting unit 18 is a nonlinear converting unit in which, when an envelope signal is generated by computing the amplitude of input signal from I and Q signals, the frequency of the envelope signal becomes wider than a band f of the original I or Q signal, resulting in band broadening.

Moreover, in the case of FIG. 2, since the amplitude-voltage converting unit 12 that performs a process of converting the amplitude value of input signal into the power supply voltage value of the amplifier also performs a nonlinear process of the signals, band-broadening of the signals may occur.

Figure 7A:
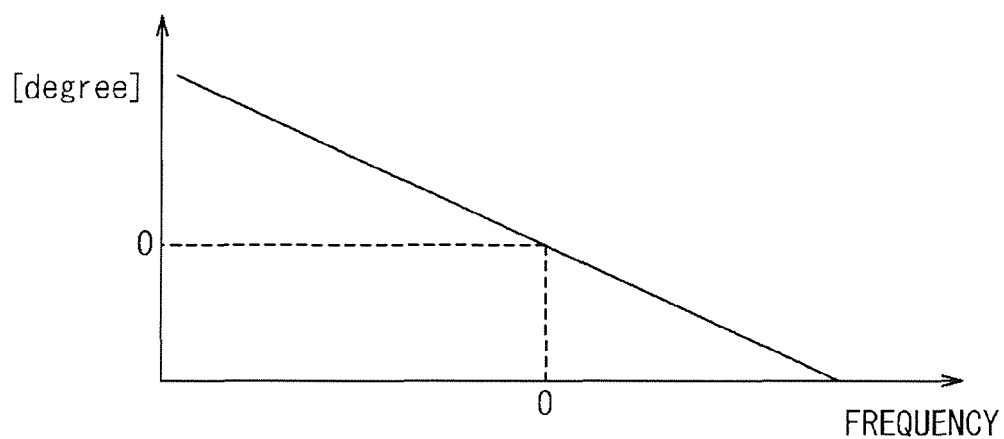
FIG. 7 is a characteristic diagram of an ideal all pass filter.
Figure 7B:
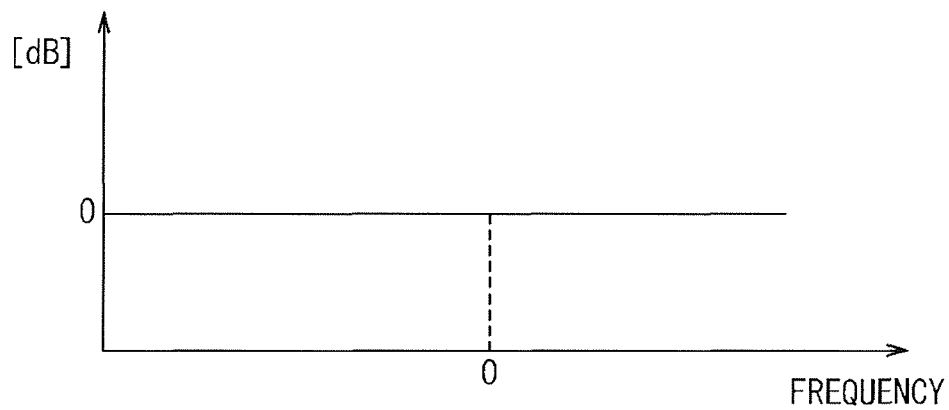

Here, taking a look at only a frequency band in a predetermined range, the digital filter forming the timing adjusting unit 17 can obtain substantially the same characteristics as ideal characteristics shown in FIG. 7 (see FIG. 8). That is, in the frequency band in the predetermined range, the digital filter has substantially ideal characteristics where the phase of a signal is changed as desired for timing adjustment.

On the other hand, as shown in FIG. 8, in those frequency bands other than the frequency band in the predetermined range (the bands on the left and right sides of the band f), both the phase and amplitude characteristics are degraded over the ideal characteristics.

The frequency band in the predetermined range where substantially ideal characteristics can be obtained is equal to the band f of the I or Q signal or is restricted to one slightly wider than the band f. That is, the band where the digital filter ideally operates ≥ the band of the I or Q signal, and the band f of the I or Q signal is within the frequency band in the predetermined range.

Note that the size of a frequency band where characteristics similar to the ideal characteristics can be obtained is determined by the number of taps (order) of the digital filter. Although the digital filter can be easily formed by reducing the number of taps, the frequency band where characteristics similar to the ideal characteristics can be obtained is narrowed. On the other hand, to extend the frequency band where characteristics similar to the ideal characteristics can be obtained, there is a need to increase the number of taps (order).

If a signal $((I^2+Q^2)^{1/2})$ whose band is wider than the frequency band in the predetermined range is inputted to the timing adjusting unit 17 in which the band where excellent characteristics can be obtained is limited within the frequency band in the predetermined range, then a filter process in which phase and amplitude characteristics are not ideal is performed, causing a problem that a delay process cannot be appropriately performed or the signal is distorted.

To solve the problem in the amplifying device in FIG. 2, there is a need to increase the number of taps of the digital filter, causing an increase in circuit size.

On the other hand, the detecting unit 16 in FIG. 1 according to the first embodiment stops computation at $(I^2+Q^2)$ and does not perform computation of $[(.)^{1/2}]$ (square root computation). The detecting unit 16 in the first embodiment generates an envelope signal, considering a value obtained by performing computation of $(I^2+Q^2)$ as the amplitude value of the input signal. The computation of $(I^2+Q^2)$ is linear conversion of the original I or Q signal and does not cause band-broadening of the signal.

As such, for a signal (envelope signal) outputted from the detecting unit 16 in the first embodiment, since computation of $[(.)^{1/2}]$ (square root computation) is not performed, the signal is not band-broadened like an output signal from the detecting unit 18 in the comparative example and thus a narrow band f of the original I or Q signal is maintained.

Then, the first timing adjusting unit 15a in the first embodiment performs timing adjustment on the signal with the narrow band f maintained. Since the digital filter forming the timing adjusting unit 15a can obtain characteristics similar to the ideal characteristics shown in FIG. 7 in a narrow band range comparable to the band f of the original I or Q signal, the digital filter can appropriately cause phase delay and perform a timing delay process. Therefore, according to the first embodiment, a transmitter can be implemented in which timing can be accurately adjusted and there is very little radiation of a distorted signal, with a relatively small circuit size.

In the second timing adjusting unit 15b in the first embodiment, too, likewise, timing adjustment is performed on baseband I and Q signals which are narrow-band signals and thus an appropriate process can be performed.

Note that while an amplitude value inputted to the amplitude-voltage converting unit 12 in the comparative example is an original amplitude value $((I^2+Q^2)^{1/2})$, a value inputted to the amplitude-voltage converting unit 12 in the first embodiment is, to be precise, the square value of an amplitude value. Therefore, strictly speaking, the amplitude-voltage converting unit 12 in the first embodiment converts the square value of the amplitude value of input signal into the power supply voltage value of the amplifier. In other words, it can be said that the amplitude-voltage converting unit 12 in the first embodiment performs computation of $[(.)^{1/2}]$ (square root computation) which should have been performed by the detecting unit 16, instead of the detecting unit 16 after timing adjustment, and performs amplitude-voltage conversion as in the comparative example.

[2. Second Embodiment Regarding an Amplifying Device Adopting a Timing Adjustment Technique]

Figure 4:
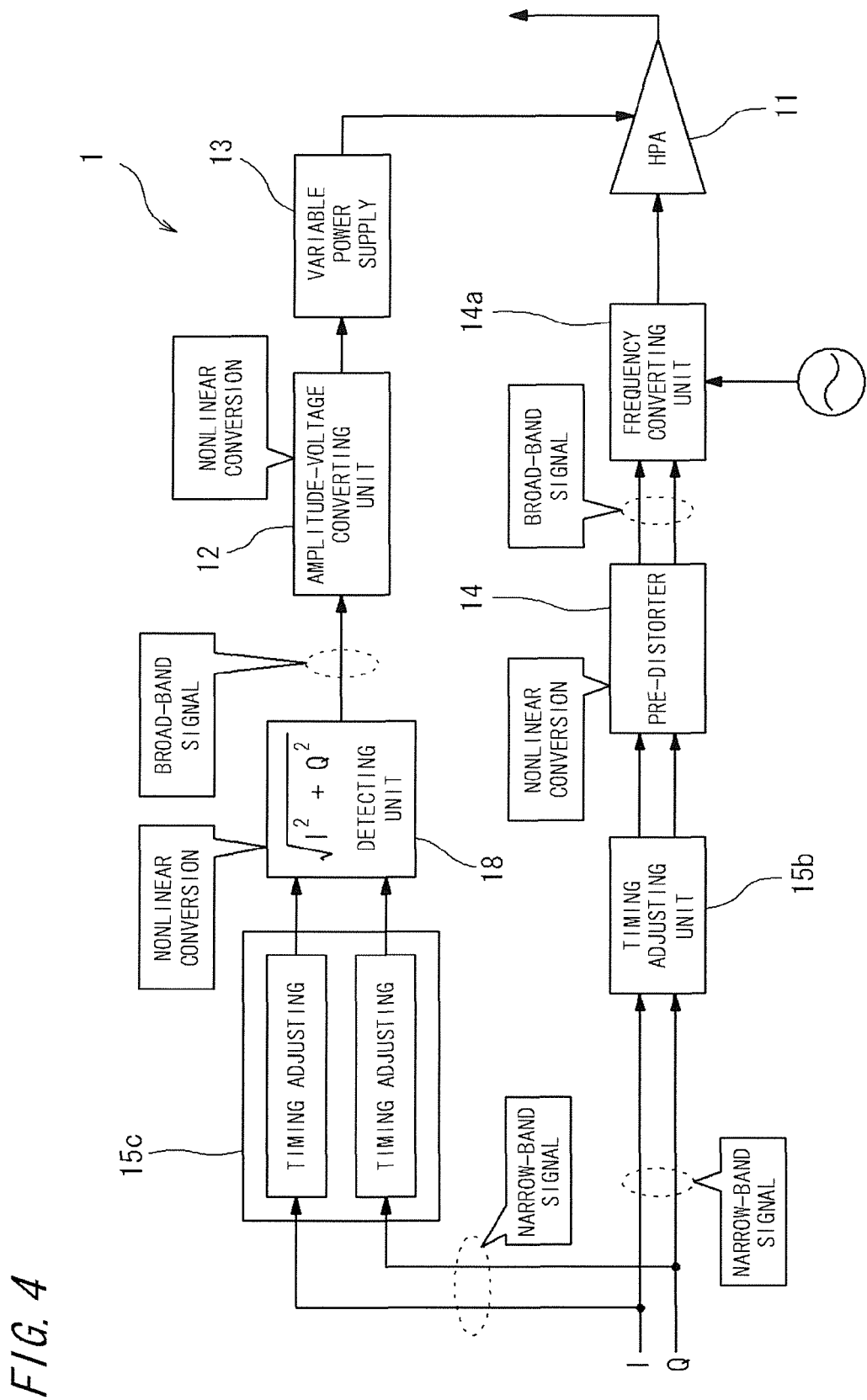
FIG. 4 is a block diagram of an amplifying device according to a second embodiment.

FIG. 4 shows an amplifying device 1 according to a second embodiment.

In the amplifying device in FIG. 4, detection of input signal is performed by a detecting unit 18 which is the same as a detecting unit 18 according to the comparative example shown in FIG. 2. That is, the detecting unit 18 in the second embodiment determines amplitude by computation of $(I^2+Q^2)^{1/2}$ to generate an envelope signal.

In the second embodiment, a timing adjusting unit 15c is provided immediately before the detecting unit 18. The configuration of the timing adjusting unit 15c itself is the same as that of timing adjusting units 15a and 15b in the first embodiment.

The timing adjusting unit 15c is provided to perform timing adjustment on each of baseband I and Q signals which are signals at a stage before the signals are band-broadened by the detecting unit 18. Therefore, since the timing adjusting unit 15c performs timing adjustment on narrow-band signals, appropriate adjustment can be performed.

Note that regarding other configurations in the second embodiment, for an amplitude-voltage converting unit 12 the same one as that in the comparative example is adopted and other configurations are the same as those in the first embodiment and thus description thereof is omitted.

[3. Third Embodiment Regarding an Amplifying Device Adopting a Timing Adjustment Technique]

Figure 5:
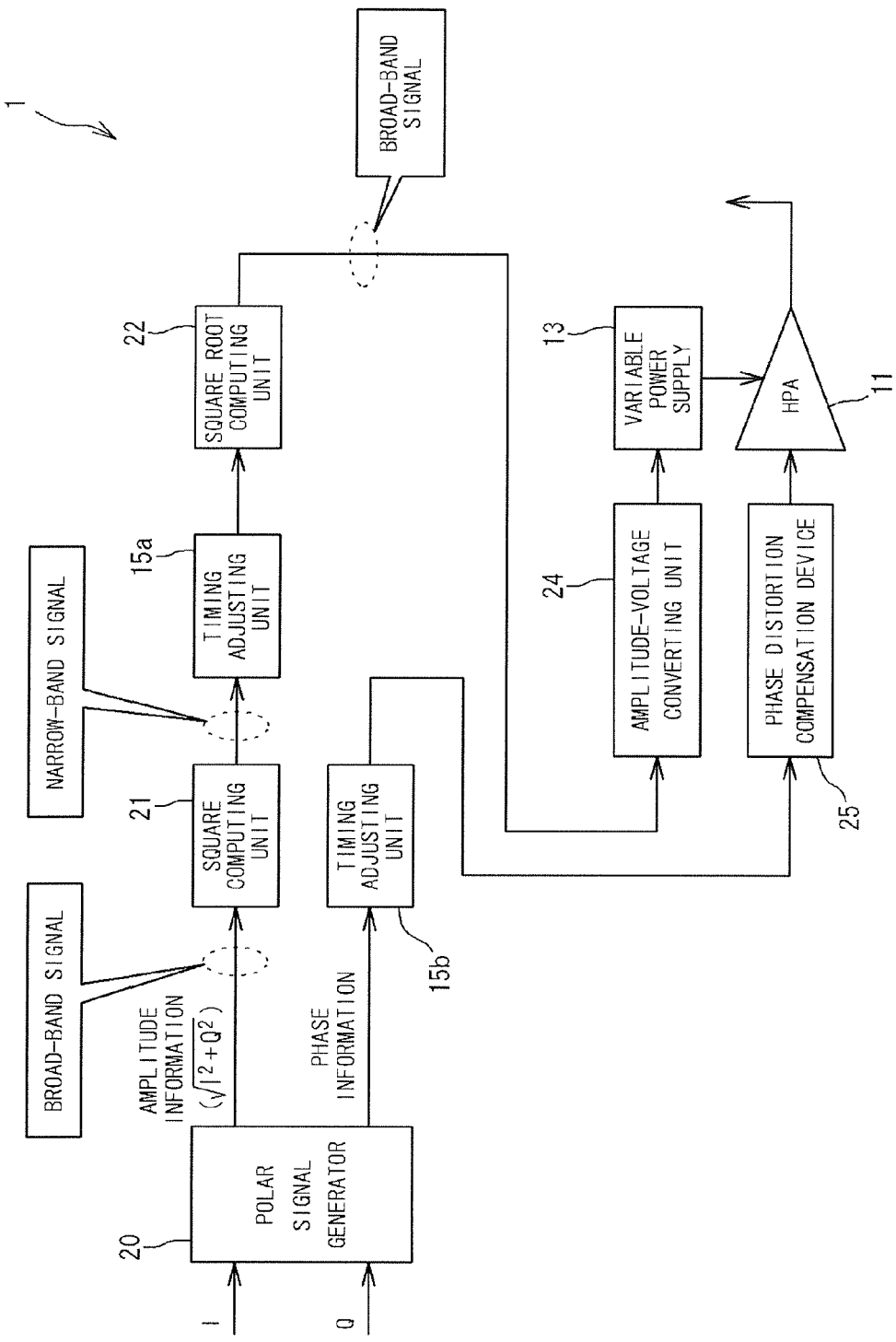
FIG. 5 is a block diagram of an amplifying device according to a third embodiment.

FIG. 5 shows an amplifying device 1 according to a third embodiment. The amplifying device 1 in FIG. 5 uses a polar modulation system (EER system) and includes a polar signal generator 20. The polar signal generator 20 outputs, based on I and Q signals, a signal (envelope signal) indicating amplitude information (($I^2+Q^2)^{1/2}$) and a signal indicating phase information.

The signal indicating amplitude information and the signal indicating phase information are subjected to timing adjustment by timing adjusting units 15a and 15b, respectively. The configuration of the timing adjusting units 15a and 15b in the third embodiment is the same as that of timing adjusting units 15a and 15b in the first embodiment.

Here, since the signal indicating amplitude information is $(I^2+Q^2)^{1/2}$ and thus is square root computed, the signal is band-broadened over the band of the I or Q signal. Hence, the signal indicating amplitude information which is outputted from the polar signal generator 20 is subjected to square computation ($x^2$) by a square computing unit 21 before being inputted to the timing adjusting unit 15a, resulting in an ($I^2+Q^2$) signal. The ($I^2+Q^2$) signal is a signal whose band is narrower than the band of $(I^2+Q^2)^{1/2}$ (a signal whose band is narrower than the band where the digital filter ideally operates).

Since the timing adjusting unit 15a performs timing adjustment on the signal that is band-narrowed by the square computing unit 21, appropriate timing adjustment can be performed.

The timing-adjusted signal ($I^2+Q^2$) outputted from the timing adjusting unit 15a is subjected to square root computation by a square root computing unit 22, whereby the signal is brought back to an $(I^2+Q^2)^{1/2}$ signal.

The $(I^2+Q^2)^{1/2}$ signal (the signal indicating amplitude information; envelope signal) is converted into the value of power supply voltage (drain voltage) to an amplifier 11 by an amplitude-voltage converting unit 24, and a power supply voltage according to the power supply voltage value is supplied to the amplifier 11 from a variable power supply 13.

Note that the signal indicating phase information which is outputted from the polar signal generator 20 is also subjected to timing adjustment by the timing adjusting unit 15b and thereafter the timing-adjusted signal is provided to a phase distortion compensation device 25 and output from the phase distortion compensation device 25 is provided to an input of the amplifier 11.

[4. Application of a Timing Adjustment Technique to Signal Processing Devices in General]

The present invention in which timing adjustment is performed on a narrow-band signal can be applied not only to amplifying devices but also widely to signal processing devices 101 that require timing adjustment.

(a) to (d) of FIG. 6 show variations of a signal processing device 101 having a timing adjusting unit 115. The timing adjusting unit 115 has the same configuration as timing adjusting units 15a and 15b in the first embodiment. That is, the timing adjusting unit 115 is formed by a digital filter of an FIR filter or IIR filter configuration and has characteristics such as those shown in FIG. 8. The filter is not an ideal all pass filter but is configured to perform a process of delaying a signal by a predetermined time by appropriately performing phase adjustment without changing amplitude in a frequency band in a predetermined range where the filter ideally operates.

In four signal processing devices 101 shown in FIG. 6, at least one of input and output has a broad-band signal whose band is wider than the band in which the timing adjusting unit 115 can appropriately perform a process.

For example, to the signal processing device 101 in (*a*) of FIG. 6 is provided, as input, a narrow-band signal (whose band is the same as a frequency band in a predetermined range where the filter ideally operates or is smaller than the band), and signal processing including timing adjustment is performed and a broad-band signal is outputted.

The signal processing device in (*a*) of FIG. 6 includes a narrow-band signal maintenance signal processing unit (first signal processing unit) 116 that maintains the band of the narrow-band signal provided to the signal processing device 101 without broadening the band (or further narrows the band); a timing adjusting unit 115 provided at a stage subsequent to the processing unit 116; and a band-broadening processing unit (second signal processing unit) 220 provided at a stage subsequent to the timing adjusting unit 115 and performing signal processing involving band-broadening of a signal.

The signal processing device 101 in (*a*) of FIG. 6 corresponds to the function of performing signal processing from the detecting unit 16 to amplitude-voltage converting unit 12 of the amplifying device 1 shown in FIG. 1. That is, the detecting unit 16 in FIG. 1 corresponds to the narrow-band maintenance signal processing unit 116 in (*a*) of FIG. 6, the first timing adjusting unit 15a in FIG. 1 corresponds to the timing adjusting unit 115 in (*a*) of FIG. 6, and the amplitude-voltage converting unit 12 in FIG. 1 corresponds to the band-broadening signal processing unit 220 in (*a*) of FIG. 6.

In the signal processing device 101 in (*a*) of FIG. 6, as described about the amplifying device 1 of the first embodiment shown in FIG. 1, signal to maintain a narrow band of the narrow-band signal inputted to the signal processing device 101 is performed and then timing adjustment is performed at a stage before a process of band-broadening the narrow-band signal. Therefore, even if a digital filter in which the band where timing adjustment can be appropriately performed is limited to a narrow band f is used as the timing adjusting unit 115, timing adjustment can be appropriately performed.

To the signal processing device 101 in (*b*) of FIG. 6 is provided, as input, a narrow-band signal as in (*a*) of FIG. 6, and signal processing including timing adjustment is performed and a broad-band signal is outputted.

The signal processing device in (*b*) of FIG. 6 includes a timing adjusting unit 115 that performs timing adjustment on the narrow-band signal which is provided to the signal processing device 101 as input; and a band-broadening processing unit 220 provided at a stage subsequent to the timing adjusting unit 115 and performing signal processing involving band-broadening of a signal.

The signal processing device 101 in (*b*) of FIG. 6 corresponds to the functions of the second timing adjusting unit 15b and pre-distorter 14 of the amplifying device 1 shown in FIG. 1 and the functions of the timing adjusting 15c and detecting unit 18 (the amplitude-voltage converting unit 12 may be included) of the amplifying device 1 shown in FIG. 4.

That is, the second timing adjusting unit 15b in FIG. 1 corresponds to the timing adjusting unit 115 in (*b*) of FIG. 6, and the pre-distorter 14 in FIG. 1 corresponds to the band-broadening signal processing unit 220 in (*b*) of FIG. 6.

In addition, the timing adjusting unit 15c in FIG. 4 corresponds to the timing adjusting unit 115 in (*b*) of FIG. 6, and the detecting unit 18 (the amplitude-voltage converting unit 12 may be included) in FIG. 4 corresponds to the band-broadening signal processing unit 220 in (b) of FIG. 6.

In the signal processing device 101 in (b) of FIG. 6, too, as described about the amplifying device 1 shown in FIG. 1 or 4, timing adjustment is performed at a stage before a process of band-broadening a signal. Therefore, even if a digital filter in which the band where timing adjustment can be appropriately performed is limited to a narrow band f is used as the timing adjusting unit 115, timing adjustment can be appropriately performed.

In the signal processing devices 101 in (c) and (d) of FIG. 6, a broad-band signal is inputted as input to the signal processing devices 101. Hence, the signal processing devices 101 in (c) and (d) of FIG. 6 each include a band-narrowing signal processing unit 210 that narrows the band of the broad-band signal to a band where a digital filter forming a timing adjusting unit 115 can appropriately perform timing adjustment (or to a band narrower than the band).

In the signal processing devices 101 in (c) and (d) of FIG. 6, timing adjustment by the timing adjusting unit 115 is performed on a signal that is band-narrowed by the band-narrowing signal processing unit 210. Therefore, even if a digital filter in which the band where timing adjustment can be appropriately performed is limited to a narrow band f is used as the timing adjusting unit 115, timing adjustment can be appropriately performed.

While in the signal processing device 101 in (d) of FIG. 6 a narrow-band signal obtained after timing adjustment directly serves as output from the signal processing device 101, in the signal processing device 101 in (c) of FIG. 6 a signal obtained after timing adjustment is band-broadened by a band-broadening processing unit 220. In the band-broadening processing unit 220, the band is preferably broadened to one that is the same as the band of the broad-band signal inputted to the signal processing device 101.

It is preferred that when the process in the band-broadening signal processing unit (second signal processing unit) 220 is considered as a function, the process in the band-narrowing signal processing unit (first signal processing unit) 210 in (c) of FIG. 6 be an inverse function to the function. In this case, the band-narrowing signal processing unit 210 generates a narrow-band signal where the band of the inputted broad-band signal is narrowed without losing information included in the broad-band signal, and the band-broadening signal processing unit 220 brings the band of a timing-adjusted narrow-band signal to its original broad band.

In a signal processing device having only a broad-band signal as a signal to be subjected to signal processing, too, by disposing a band-narrowing processing unit 210 and a band-broadening processing unit 220 such as those described above before and after a timing adjusting unit 115, timing adjustment of a broad-band signal can be performed without affecting other signal processing.

The signal processing device 101 in (c) of FIG. 6 specifically corresponds to the functions of the square computing unit 21 to the square root computing unit 22 which are shown in FIG. 5. Specifically, the square computing unit 21 in FIG. 5 corresponds to the band-narrowing signal processing unit 210 in (c) of FIG. 6, the timing adjusting unit 15a in FIG. 5 corresponds to the timing adjusting unit 115 in (c) of FIG. 6, and the square root computing unit 22 in FIG. 5 corresponds to the band-broadening signal processing unit 220 in (c) of FIG. 6. Computations performed by the square computing unit 21 and the square root computing unit 22 in FIG. 5 are opposite functions.

In addition, the signal processing device 1 in (c) of FIG. 6 specifically corresponds to a configuration in which in FIG. 5 output from the timing adjusting unit 15a is directly provided to the variable power supply 13. Specifically, the square computing unit 21 in FIG. 5 corresponds to the band-narrowing signal processing unit 210 in (d) of FIG. 6, and the timing adjusting unit 15a in FIG. 5 corresponds to the timing adjusting unit 115 in (d) of FIG. 6. The variable power supply 13 in this case is configured to have the function of being able to directly determine a power supply voltage value based on an $(I^2+Q^2)$ signal.

It is to be noted that the embodiments disclosed herein are to be considered in all respects as illustrative and not restrictive. The scope of the present invention is indicated by the appended claims rather than by the foregoing meaning, and all changes which come within the meanings and range of equivalency of the claims are therefore intended to be embraced therein.

What is claimed is:

1. An amplifying device comprising:
an amplifier;
a signal processing unit that converts an envelope signal of the input signal to be provided to an input of the amplifier into a power supply voltage value of the amplifier, and band-broadens the envelope signal upon the conversion;
a timing adjusting unit that performs timing adjustment on the envelope signal by phase adjustment by a digital filter; and
a detecting unit that performs detection on the input signal to generate the envelope signal; wherein
the timing adjusting unit is provided to perform the timing adjustment of the envelope signal at a stage before the envelope signal is band-broadened by the signal processing unit, and
the detecting unit is configured to output an envelope signal generated considering a value obtained by computation of $(I^2+Q^2)$ as an amplitude value, when values of an I signal and a Q signal forming the input signal are represented by I and Q, respectively.

2. The amplifying device according to claim 1, wherein the timing adjustment by the timing adjusting unit is performed to allow timing of an input signal to be provided to an input of the amplifier to coincide with timing of the envelope signal of the input signal.

3. An amplifying device comprising:
an amplifier;
a detecting unit that performs detection on an input signal to generate an envelope signal;
a converting unit that converts the envelope signal into a power supply voltage value of the amplifier; and
a timing adjusting unit that performs timing adjustment on the envelope signal by phase adjustment by a digital filter, wherein
the detecting unit is configured to output an envelope signal generated considering a value obtained by computation of $(I^2+Q^2)$ as an amplitude value, when values of an I signal and a Q signal forming the input signal are represented by I and Q, respectively.

4. The amplifying device according to claim 3, wherein the digital filter has substantially ideal characteristics where a phase of a signal in a frequency band in a predetermined range is changed as desired for timing adjustment, and
a frequency band of the signal on which timing adjustment is performed by the timing adjusting unit is substantially within the frequency band in the predetermined range.

5. The amplifying device according to claim 1, wherein the digital filter has substantially ideal characteristics where a phase of a signal in a frequency band in a predetermined range is changed as desired for timing adjustment, and
a frequency band of the signal on which timing adjustment is performed by the timing adjusting unit is substantially within the frequency band in the predetermined range.

* * * * *